(12) United States Patent
Toomey (10) Patent No.: US 8,178,931 B2
(45) Date of Patent: May 15, 2012

(54) BRIDGE FOR SEMICONDUCTOR INTERNAL NODE

(75) Inventor: James J. Toomey, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 675 days.

(21) Appl. No.: 12/335,761

(22) Filed: Dec. 16, 2008

(65) Prior Publication Data

US 2009/0096101 A1 Apr. 16, 2009

Related U.S. Application Data

(62) Division of application No. 11/468,102, filed on Aug. 29, 2006, now Pat. No. 7,510,960.

(51) Int. Cl.
*H01L 29/76* (2006.01)
*H01L 29/94* (2006.01)

(52) U.S. Cl. ............... 257/382; 257/383; 257/903

(58) Field of Classification Search ............... 257/277, 257/382–385, 903, 904, 377, E23.157
See application file for complete search history.

(56) References Cited

U.S. PATENT DOCUMENTS

| | | | |
|---|---|---|---|
| 4,762,556 A | | 8/1988 | Hodgkin et al. |
| 5,977,638 A | | 11/1999 | Rodgers et al. |
| 5,990,493 A | * | 11/1999 | Gardner et al. ............... 257/77 |
| 6,065,143 A | | 5/2000 | Yamasaki et al. |
| 6,096,580 A | | 8/2000 | Iyer et al. |
| 6,100,568 A | * | 8/2000 | Lage ............................. 257/392 |
| 6,141,245 A | | 10/2000 | Bertin et al. |
| 6,323,535 B1 | | 11/2001 | Iyer et al. |
| 6,346,846 B1 | | 2/2002 | Bertin et al. |
| 6,388,305 B1 | | 5/2002 | Bertin et al. |
| 6,396,120 B1 | | 5/2002 | Bertin et al. |
| 6,396,121 B1 | | 5/2002 | Bertin et al. |
| 6,433,404 B1 | | 8/2002 | Iyer et al. |
| 6,498,056 B1 | | 12/2002 | Motsiff et al. |
| 6,570,207 B2 | | 5/2003 | Hsu et al. |
| 6,577,156 B2 | | 6/2003 | Anand et al. |
| 6,621,324 B2 | | 9/2003 | Fifield et al. |
| 6,624,031 B2 | | 9/2003 | Abadeer et al. |
| 6,624,499 B2 | | 9/2003 | Kothandaraman et al. |
| 6,627,361 B2 | | 9/2003 | Bula et al. |
| 6,633,055 B2 | | 10/2003 | Bertin et al. |
| 6,660,664 B1 | | 12/2003 | Adkisson et al. |
| 6,753,590 B2 | | 6/2004 | Fifield et al. |
| 6,777,146 B1 | | 8/2004 | Samuels |
| 6,794,726 B2 | | 9/2004 | Radens et al. |
| 6,832,364 B2 | | 12/2004 | Heng et al. |

(Continued)

FOREIGN PATENT DOCUMENTS

WO WO/2005069082 A1 7/2005

*Primary Examiner* — Hung Vu
(74) *Attorney, Agent, or Firm* — Joseph P. Abate; Howard M. Cohn (57) ABSTRACT

A method and apparatus for forming connections within a semiconductor device is disclosed. The semiconductor device incorporates a contact bridge between transistor contacts in close proximity. The contact bridge comprises a plurality of metal pillars each having a lower end in electrical contact with first and second transistor elements, respectively; one or more intermediate metal pillars disposed between and in electrical contact with an upper end of the metal pillars; and one or more separation regions of dielectric disposed below the intermediate metal pillar and between the lower ends of the first and second metal pillars.

4 Claims, 9 Drawing Sheets

U.S. PATENT DOCUMENTS

| | | |
|---|---|---|
| 6,879,021 B1 | 4/2005 | Fifield et al. |
| 6,882,027 B2 | 4/2005 | Brintzinger et al. |
| 6,964,032 B2 | 11/2005 | Liebmann et al. |
| 6,972,614 B2 | 12/2005 | Anderson, II et al. |
| 7,001,693 B2 | 2/2006 | Liebmann et al. |
| 7,013,439 B2 | 3/2006 | Robles et al. |
| 7,018,746 B2 | 3/2006 | Cui et al. |
| 2003/0008216 A1 | 1/2003 | Bula et al. |
| 2004/0005089 A1 | 1/2004 | Robles et al. |
| 2004/0063000 A1 | 4/2004 | Maurer et al. |
| 2004/0068712 A1 | 4/2004 | Heng et al. |
| 2004/0107412 A1 | 6/2004 | Pack et al. |
| 2004/0128118 A1 | 7/2004 | Croffie et al. |
| 2004/0133369 A1 | 7/2004 | Pack et al. |
| 2004/0155277 A1* | 8/2004 | Koh ............................ 257/303 |
| 2004/0166418 A1 | 8/2004 | Samuels |
| 2004/0170905 A1 | 9/2004 | Liebmann et al. |
| 2004/0172610 A1 | 9/2004 | Liebmann et al. |
| 2004/0190008 A1 | 9/2004 | Mieher et al. |
| 2004/0207829 A1 | 10/2004 | Hansen et al. |
| 2004/0209169 A1 | 10/2004 | Cui et al. |
| 2004/0209170 A1 | 10/2004 | Broeke et al. |
| 2004/0229131 A1 | 11/2004 | Lin et al. |
| 2004/0237061 A1 | 11/2004 | Kahng et al. |
| 2004/0248045 A1 | 12/2004 | Tanaka et al. |
| 2005/0015233 A1 | 1/2005 | Gordon |
| 2005/0044513 A1 | 2/2005 | Robles et al. |
| 2005/0048377 A1 | 3/2005 | Yang |
| 2005/0084769 A1 | 4/2005 | Pinkerton et al. |
| 2005/0094121 A1 | 5/2005 | Hansen et al. |
| 2005/0112474 A1 | 5/2005 | Sandstrom |
| 2005/0120326 A1 | 6/2005 | Semmler |
| 2005/0153212 A1 | 7/2005 | Lavin et al. |
| 2005/0193363 A1 | 9/2005 | Gupta et al. |
| 2005/0202321 A1 | 9/2005 | Gordon et al. |
| 2005/0202326 A1 | 9/2005 | Gordon et al. |
| 2005/0216875 A1 | 9/2005 | Zhang et al. |
| 2005/0216877 A1 | 9/2005 | Pack et al. |
| 2005/0262467 A1 | 11/2005 | Croffie |
| 2005/0268256 A1 | 12/2005 | Tsai et al. |
| 2005/0287483 A1 | 12/2005 | Lercel et al. |
| 2006/0051682 A1 | 3/2006 | Hess et al. |
| 2006/0062445 A1 | 3/2006 | Verma et al. |
| 2006/0068334 A1 | 3/2006 | Sandstrom et al. |
| 2006/0075371 A1 | 4/2006 | Kamat |
| 2006/0075379 A1 | 4/2006 | Kamat |
| 2006/0101370 A1 | 5/2006 | Cui et al. |

* cited by examiner

FIG. 13C

BRIDGE FOR SEMICONDUCTOR INTERNAL NODE

CROSS REFERENCE TO RELATED APPLICATIONS

This application is a division of commonly-owned, copending U.S. patent application Ser. No. 11/468,102 filed on entitled BRIDGE FOR SEMICONDUCTOR INTERNAL NODE, and filed on Aug. 29, 2006.

FIELD OF THE INVENTION

The present invention generally relates to the field of semiconductor fabrication. More particularly, the present invention relates to a method and apparatus for forming connections within a semiconductor device.

BACKGROUND

Figure 1:
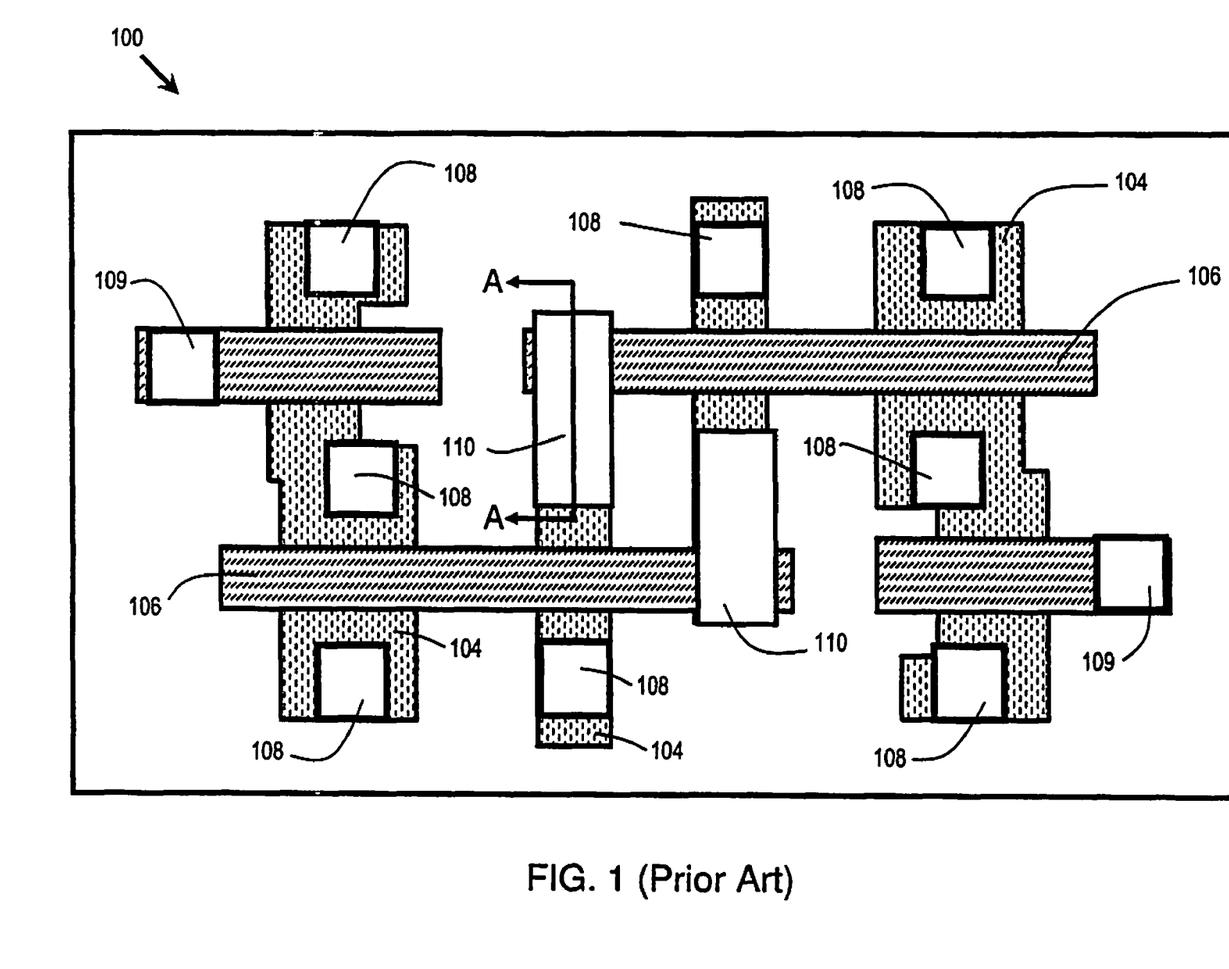
FIG. 1 is a plan view of a schematic of a design pattern of a prior art semiconductor device.

In semiconductor design, particularly SRAM design, it is often desirable to create a contact bridge between contacts in very close proximity. FIG. 1 shows a plan view of a schematic representation of design pattern for an exemplary semiconductor device 100 typically disposed on an integrated circuit (IC). The device 100 is formed on a silicon substrate (not shown). Using standard lithographic methods that are well known in the art, an etch is performed on the silicon substrate, resulting in reduced thickness of the silicon substrate (known as a shallow trench), except for the places where the lithographic method prevented the etch from occurring. These areas 104 which were not etched away are referred to as silicon traces. Continuing the process, a dielectric layer 114 is applied to cover the then exposed upper surface of the device 100. Then, the dielectric layer 114 is partially removed, typically by polishing, so that only the upper surface of each silicon trace 104 is exposed. Continuing, a layer of polycrystalline silicon is applied to cover the then exposed upper surface of the device 100. Using standard lithographic methods that are well known in the art, an etch is performed on the surface to form a plurality of polycrystalline silicon (referred to as polysilicon) lines or traces 106. FIG. 1 shows the relationship between the silicon traces 104 and polycrystalline silicon traces 106. Continuing, a dielectric layer 112 is applied across the then exposed upper surface of the device 100. Portions of the dielectric layer 112 are then removed using standard lithographic methods leaving sidewall spacers 112A and 112B on either side of silicon traces 106. Next a dielectric layer 116 is applied across the then exposed upper surface of the device 100. Finally, according to the prior art, conductive contacts 108, 109, referred to as a CA (contact area), and contact area rectangle structures 110, referred to as a CAREC herein, are put in place, as described below. The conductive contacts 108, 109 make electrical contact with the silicon traces 104 and polysilicon traces 106, respectively. It is sometimes desirable to connect a gate of one transistor to a source or drain of another transistor in close proximity. In order to make this connection, the CAREC 110 can be used. The CAREC 110 is a form of well known local interconnect wiring. To form the contacts 108, 109 and CAREC 110, the dielectric layer 116 is etched away to form cavities, such as cavity 115 in FIG. 2. Then a conductive material such as tungsten is deposited in the cavities to form conductive pillars. These pillars form the CAs 108,109 and CARECs 110.

The semiconductor device 110 is generally comprised of an arrangement of many transistors on a silicon substrate. The plurality of transistors is formed by the arrangement of the silicon traces 104 and the polysilicon traces 106, which form the source or drain of each transistor. As shown in FIG. 1, the contacts 108 are in electrical contact with silicon traces 104 and contacts 109 are in electrical contact on the polysilicon traces 106.

It should clearly be understood that FIG. 1 illustrates but an extremely small (microscopic) portion of an integrated circuit (IC) device, let alone a semiconductor wafer comprising a large plurality of such devices. For example, what is shown may have a width of only a few microns (pm) of a semiconductor wafer having a diameter of several inches. Also, in "real life" things are not so neat and clean, rectilinear and uniform as shown. However, for one of ordinary skill in the art to which the invention most nearly pertains, this and other figures presented in this patent application will be very useful, when taken in context of the associated descriptive text, for understanding the invention.

The semiconductor device 100 shown in FIG. 1 (as well as in the other Figures) is fabricated utilizing conventional processing steps well known to those skilled in the art. Since such techniques are well known and are not critical for understanding the present invention, a detailed discussion of the same is not given herein. It will be understood that various steps and materials have been omitted, for illustrative clarity, such as seed layers, adhesion layers, cleaning steps and the like.

Figure 2:
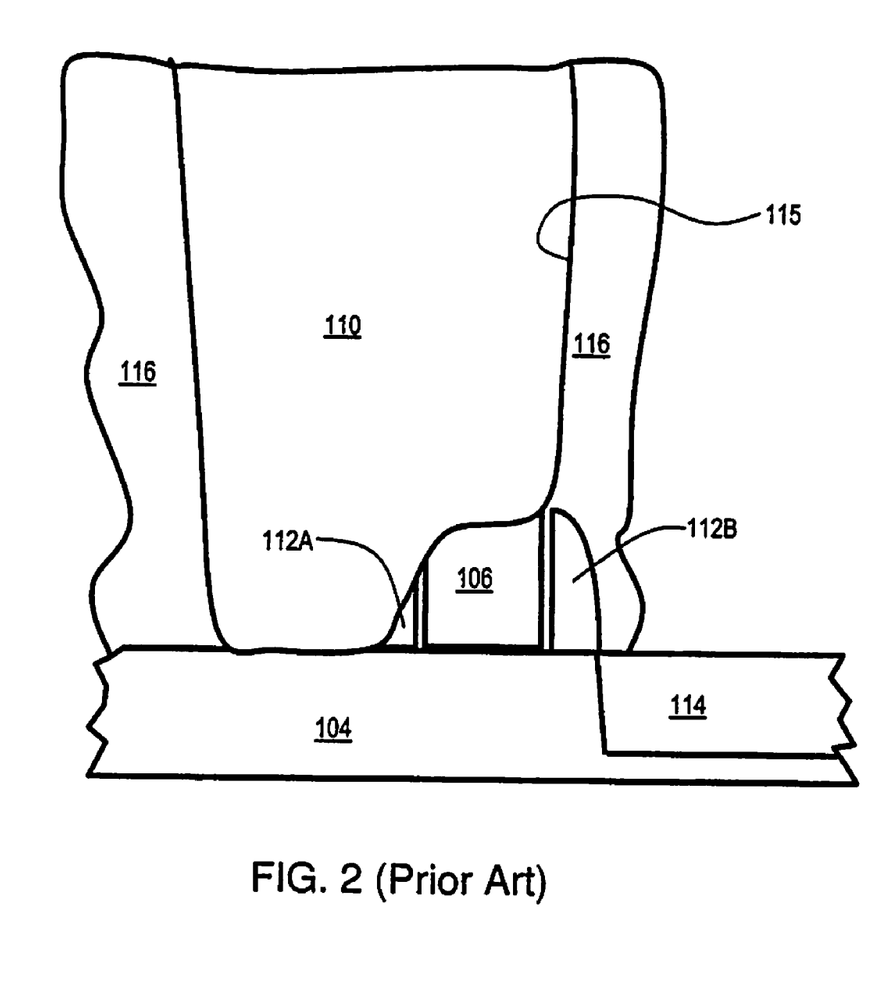
FIG. 2 is a cross section view of a portion of the semiconductor device of FIG. 1 showing the CAREC and the damage to a spacer and a portion of the upper surface of a silicon trace.

FIG. 2 shows a cross sectional view of a portion of semiconductor device 100, as viewed along line A-A of FIG. 1, showing the details of CAREC 110. The CAs 108,109 (shown in FIG. 1) and the CARECs 110 are formed by using a selective etch to etch cavities in the dielectric 116 until the desired silicon or polysilicon layer is reached. Then a conductive material such as tungsten is deposited in the cavities to form conductive pillars. These pillars form the CAs 108, 109 and CARECs 110.

Referring again to FIG. 2, CAREC 110 can be formed by first performing a reactive ion etch on the desired area to remove a portion of dielectric layer 116. This etching forms a cavity 115 that is filled with a conductive metal, such as tungsten. The result is shown in FIG. 2, in which CAREC 110 is formed over polysilicon trace 106. Polysilicon trace 106 serves as the gate of a transistor. Adjacent and on either side of polysilicon trace 106 are sidewall spacers 112A and 112B. The sidewall spacers 112A and 112B are important during the etching process to prevent damage to the doping implants under silicon trace 104 and polysilicon trace 106. Ideally, sidewall spacers 112A and 112B should be approximately symmetrical. However, because, the etching of the cavities forming pillars CAs 108,109 and CARECs 110 occurs at the same time, sidewall spacer 112A gets more eroded by the etch process, since on the left side, the cavity 115 is deeper so as to reach trace 104 as compared to the right side where the cavity 115 goes down to the trace 106. The result is damage to spacer 112A, and a portion of the upper surface of silicon trace 104. This damage may adversely remove dopants that were put there prior to the etching step, during the implant phase of the manufacturing process. This creates a high resistance element, which degrades the performance of the semiconductor.

There are multiple drawbacks to this process. First, the etching process works on a global level. Therefore, it is desirable to have one consistent shape for etching, so that dielectric material will be etched at a similar rate. The CARECs 110 have approximately double the area of the CAs 108 and 109. The area being etched effects the rate of etch. Therefore, with shapes of various areas being etched, the etching process is not as consistent as it would be if one uniform shape was used. Second, etching the CAREC may compromise the sidewall spacer of the transistor and remove dopants, resulting in degraded semiconductor performance. As the demands of technology require more complex functionality in products having size constraints, such as portable electronics products, there is an increasing need to fit more transistors on a semiconductor device. Therefore, what is needed is an improved connection method that allows the flexibility of connecting contacts in close proximity, provides a consistent etch shape, and does not compromise the integrity of a sidewall spacer or cause unwanted removal of dopants.

SUMMARY OF THE INVENTION

According to the present invention, there is disclosed a method for fabricating a connection between two transistor elements on a semiconductor substrate. The method comprises the following steps: providing the semiconductor substrate with a silicon line forming a first transistor element, a polysilicon line forming a second transistor element, a first side spacer on one side of second transistor element and a second side spacer on an opposite side of the second transistor element, and a dielectric layer overlying the first transistor element, the second transistor element, and the first and second side spacers; applying a layer of photo resist over an upper surface of the dielectric layer; photo patterning said photo resist layer to form at least first and second contact areas with an area of photo resist therebetween; forming at least first and second cavities corresponding to the at least first and second contact areas extending through the photo resist layer to the dielectric layer with a region of the photo resist remaining therebetween; etching the dielectric layer through the at least first and second cavities to form at least first and second contact cavities in the dielectric layer and concurrently reducing the thickness of the photo resist layer and resist region to form a first intermediate cavity between first and second contact cavities and a first separation region of the dielectric layer between the first and second contact cavities; further etching the dielectric layer until the first contact cavity contacts the first transistor element, the second contact cavity contacts the second transistor element, the first intermediate cavity extends between contact cavities and down to the first separation region of the dielectric layer between contact cavities; and depositing conductive metal in the first and second contact cavities and in the intermediate cavity to form a first, a second and an intermediate conductive metal pillar.

Further according to the present invention, the method includes joining the first, second and intermediate conductive metal pillars together at an upper end top thereof and placing them in electrical contact with the first transistor element and the second transistor element at a bottom end thereof and isolating the intermediate conductive metal pillar from the first side spacer with the first separation region to form a double CA bridge structure.

Still further according to the present invention, the method includes selecting the conductive metal from the group consisting of tungsten and copper.

Also according to the present invention, the method includes etching with a reactive ion etch process.

Yet further according to the present invention, the step of depositing conductive metal in the first and second contact cavities and the intermediate cavity creates an excess layer of conductive metal across the upper surface of the dielectric layer. The excess conductive metal can be removed from the upper surface of the dielectric layer via a chemical mechanical polish.

Further according to the present invention, the method includes forming a triple CA bridge structure with first, second and third contact cavities, first and second intermediate cavities and first and second separation regions for isolating first, second and third side spacers. Then depositing conductive metal in the first, second and third contact cavities and in the first and second intermediate cavities to form first, second and third conductive metal pillars and a first and second intermediate conductive metal pillars. This causes the first intermediate conductive metal pillar to be disposed between the first and second conductive metal pillars and the second intermediate conductive metal pillar to be disposed between the second and third conductive metal pillars. Also the first separation region is disposed between the first and second conductive metal pillars and the second separation region is disposed between the second and third conductive metal pillars, thereby forming a triple CA bridge structure.

Yet further according to the present invention, a quad CA bridge structure can be formed by the steps of forming first, second and third and fourth contact cavities, first, second and third intermediate cavities and first, second and third separation regions for isolating the first, second, third and fourth side spacers. Then depositing conductive metal in the first, second, third and fourth contact cavities and in the first, second and third intermediate cavities to form first, second, third and fourth conductive metal pillars and first, second and third intermediate conductive metal pillars. The first intermediate conductive metal pillar is disposed between the first and second conductive metal pillars, the second intermediate conductive metal pillar is disposed between the second and third conductive metal pillars, the third intermediate conductive metal pillar is disposed between the third and fourth conductive metal pillars. The first separation region is disposed between the first and second conductive metal pillars, the second separation region is disposed between the second and third conductive metal pillars, and the third separation region is disposed between the third and fourth conductive metal pillars thereby forming a quad CA bridge structure. When the first, second, third, and fourth conductive metal pillars are arranged linearly, a linear quad CA bridge structure is formed. Also when the first conductive metal pillar is arranged at a right angle in relation to the second, third, and fourth conductive metal pillars, a quad CA 'L' bridge structure is created.

Also further according to the present invention, there is disclosed a semiconductor device having a contact bridge between transistor contacts in close proximity. The contact bridge comprises at least first and second metal pillars each having a lower end in electrical contact with first and second transistor elements, respectively; at least a first intermediate metal pillar being disposed between and in electrical contact with an upper end of the first and second metal pillars; and at least a first separation region of dielectric disposed below first intermediate metal pillar and between the lower ends of the first and second metal pillars.

Still further according to the present invention, the semiconductor device incorporates the first and second metal pillars, the intermediate metal pillar and the first separation region being arranged substantially vertically; the first metal pillar is oriented above and in contact with the first transistor element; the second metal pillar is oriented above and in contact with the second transistor element; first and second sidewall spacers are disposed on opposite sides of the second transistor; and first separation region of dielectric isolates the first sidewall spacer from the first intermediate metal pillar.

Also further according to the present invention, the contact bridge further comprises:
at least first, second and third metal pillars each having a lower end in electrical contact with first, second and third transistor elements, respectively; at least first and second intermediate metal pillars being disposed between and in electrical contact with an upper end of the first, second and third metal pillars; and at least first and second separation regions of dielectric disposed below the first and second intermediate metal pillars and between the lower ends of the first, second and third metal pillars.

Still further, the semiconductor device has: the first, second and third metal pillars, the first and second intermediate metal pillars and the first and second separation regions are arranged substantially vertically; the first metal pillar is oriented above and in contact with the first transistor element; the second metal pillar is oriented above and in contact with the second transistor element; the third metal pillar is oriented above and in contact with the third transistor element; first and second sidewall spacers are disposed on opposite sides of the second transistor; and the second sidewall spacer and a third sidewall spacer are disposed on opposite sides of the third transistor; and the first separation region of dielectric isolates the first sidewall spacer from the first intermediate metal pillar and the second separation region of dielectric isolates the third sidewall spacer from the third intermediate metal pillar.

DETAILED DESCRIPTION OF PREFERRED EMBODIMENTS

Figure 3:
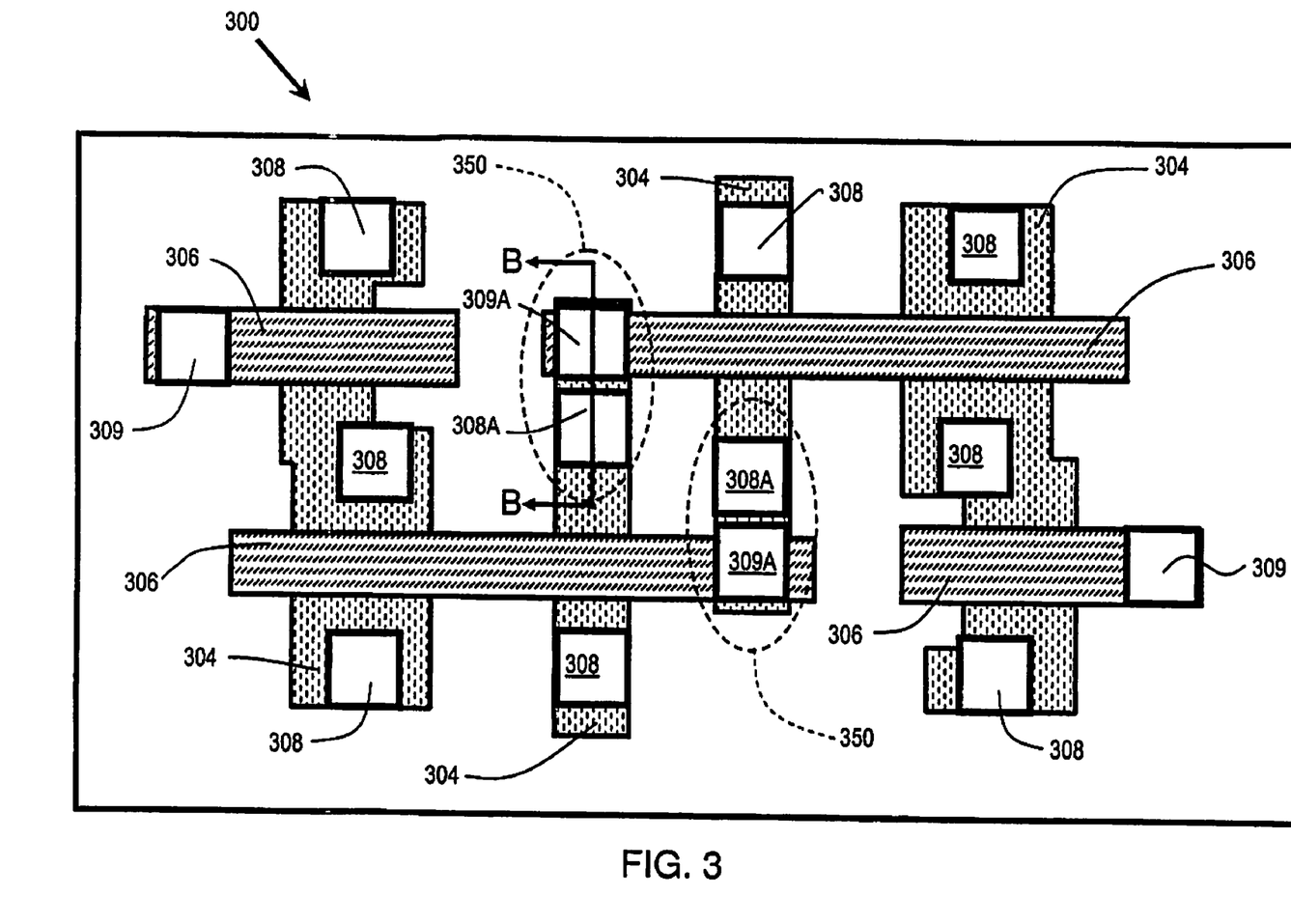
FIG. 3 is a plan view of a design pattern placed on the upper surface of a semiconductor device prior to etching the cavities forming the contacts and twin CA structure, according to the present invention.

FIG. 3 shows a schematic illustration of an intermediate stage in the construction of an exemplary embodiment semiconductor device 300 of the present invention. Semiconductor device 300 is similar to semiconductor device 100 of FIG. 1, with the exception that twin CA bridge structures 350 described below have been used to replace the CARECs 110 of FIG. 1. That is to say, polysilicon lines 306 are similar to polysilicon lines 106 of FIG. 1, silicon lines 304 are similar to silicon line 104 of FIG. 1, and contacts 308, 309 are generally similar to contacts 108, 109 of FIG. 1.

To form twin CA bridge structures 350, two particular contact areas of interest, indicated as 308A and 309A are placed in close proximity to each other. As illustrated in FIG. 3, contact area 308A is placed on a silicon trace 304, and contact area 309A is placed on a polysilicon trace 306.

Where previously a CAREC 110 (see FIG. 1) was used to join two traces 304 and 306 in close proximity, the twin CA bridge structure 350 as described below, interconnects the two traces 304, 306, without the problems of the CAREC 110. In the semiconductor device 300 of FIG. 3, all of the contact areas, i.e. CAs 308 and 309, are preferably formed with substantially the same cross sectional area and with the same square shape. Using the same configuration, makes the etching process of the CAs more efficient and predictable because, being of substantially the same size and geometry, they etch at the same rate and to the same depth in essentially the same amount of time.

Figure 4:
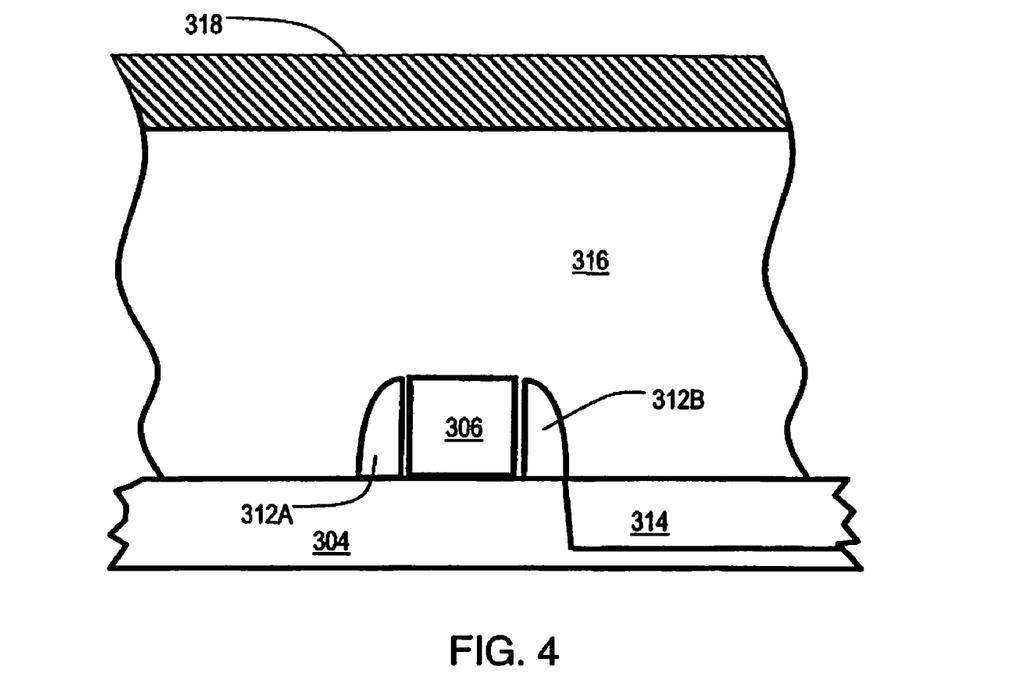
FIGS. 4-12 is a view through line A-A of FIG. 3 showing the various steps required to form the twin CA bridge structure.

FIG. 4 shows an intermediate stage of the construction of a semiconductor device 300 where the first, second and third dielectric layers 314, 312 and 316 have already been applied. A layer 318 of photo resist is applied having a thickness in the range of 200 nanometers to 600 nanometers.

Figure 5:
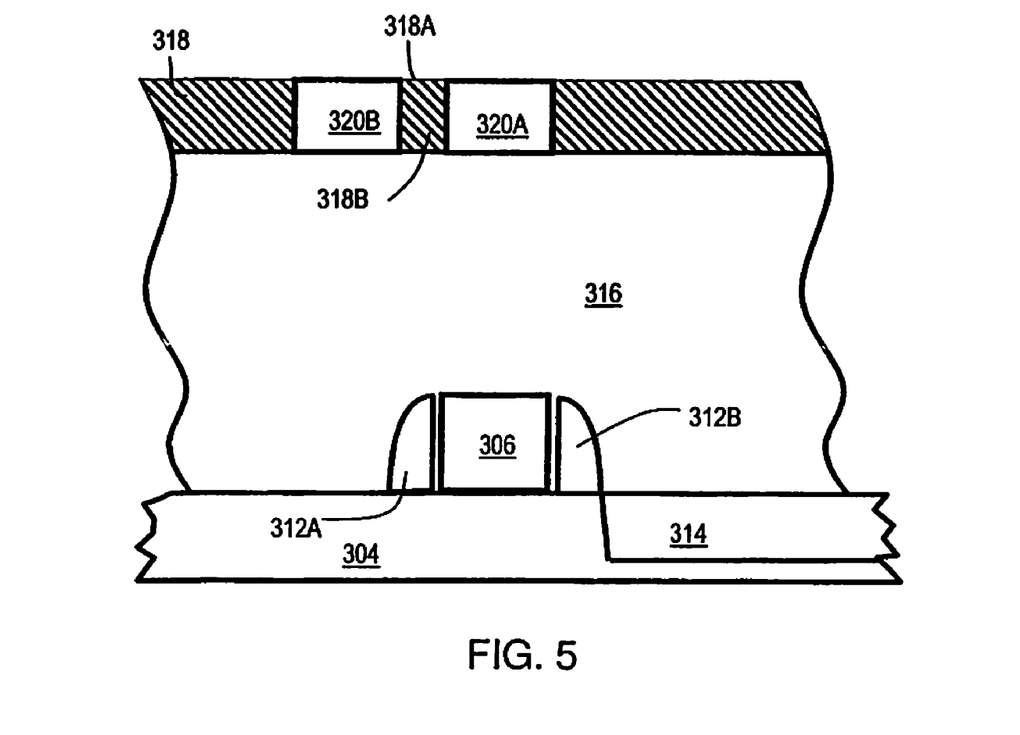

Next, as shown in FIG. 5, a view through line B-B of FIG. 3, using graphic methods, first and second, substantially identical CA shaped cavities 320A and 320B, are formed through the surface of resist 318. One of the CAs 320A is aligned with polysilicon line 306. The other one of the CAs 320B is aligned silicon line 304 and to the left of line 306. Between CA 320A and CAs 320B, a sliver region 318A of resist aligned above a first side spacer 312A of a dielectric 312 remains. This sliver resist region 318A is important for forming the twin CA bridge structure 350 of the present invention, as will be described hereinafter.

Figure 6:
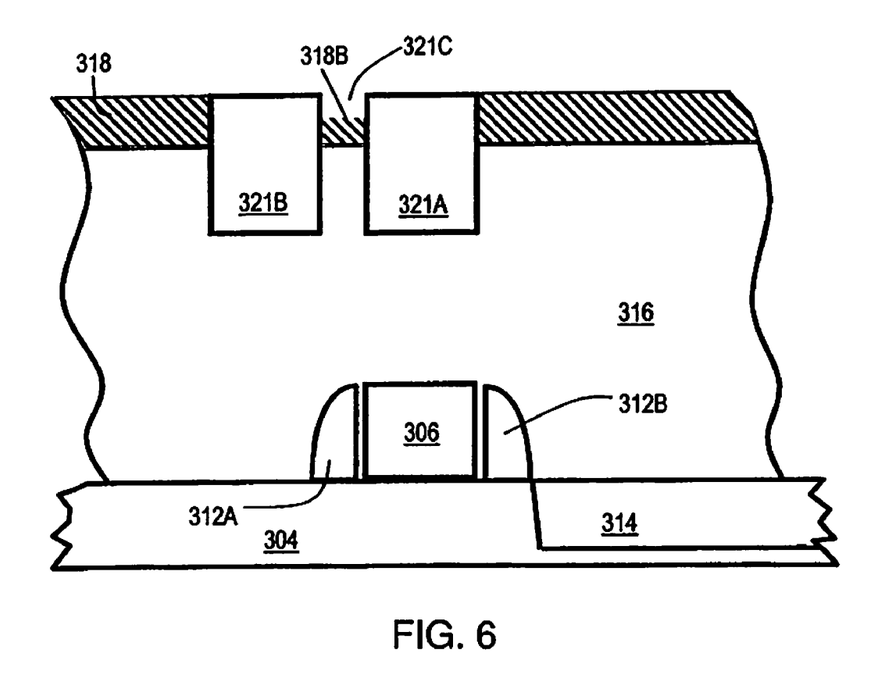

FIG. 6 shows the beginning of an etch step where cavities 321A and 321B are being etched down into dielectric layer 316. The resist layer 318B is also getting worn away to form a cavity 320C between cavities 320A and 320B by the etch process. The cavity 321C actually creates a single cavity with cavities 321A and 321B. Note that the sliver resist region 318B is etched away at a faster rate than the rest of the resist, due to the increased ratio of surface area to volume of that feature, as compared with the rest of the photo resist 318.

Figure 7:
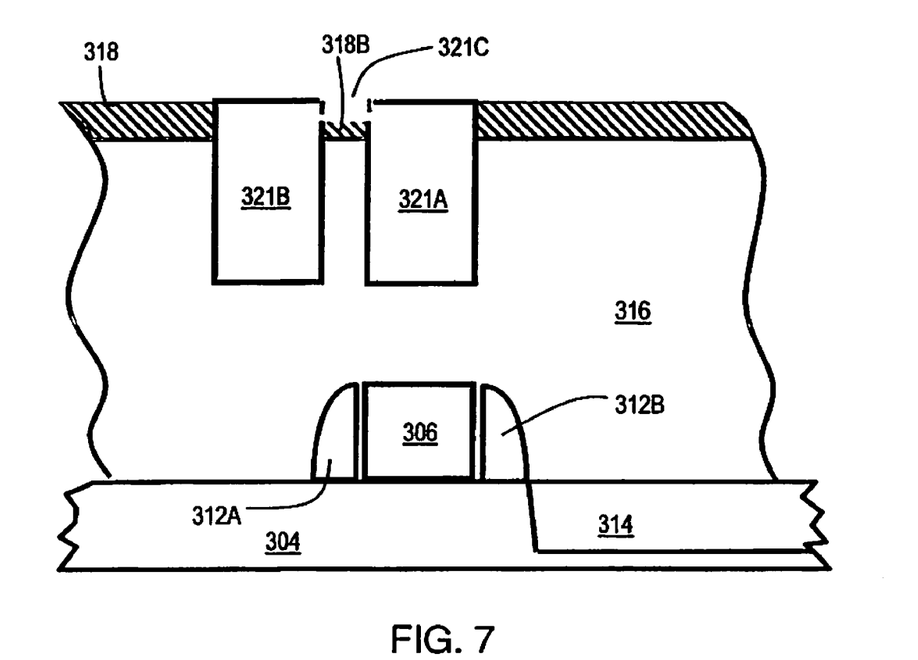

FIG. 7 shows the etch process further along from FIG. 6. Now, cavities 321A and 321B project further into dielectric layer 316 and cavity 321C is beginning to get longer in the resist layer 318. At this stage of the process, the resist layer 318 is very thin but still intact. However, the sliver resist region 318B is now very thin.

Figure 8:
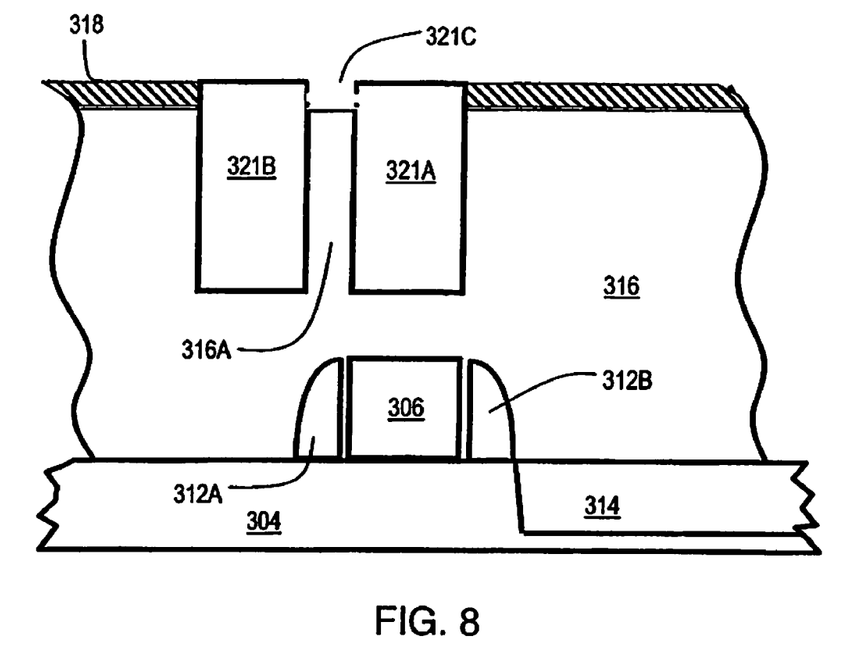

FIG. 8 shows the sliver resist region 318A completely removed from continued etching. The rest of the resist 318, while thinner, is still intact. Cavities 321A and 321B are still deeper and intermediate cavity 321C extends downward between cavities 321A and 320B. Directly below intermediate cavity 321C is a separation region 316A of dielectric layer 316 between cavities 321A and 320B.

Figure 9:
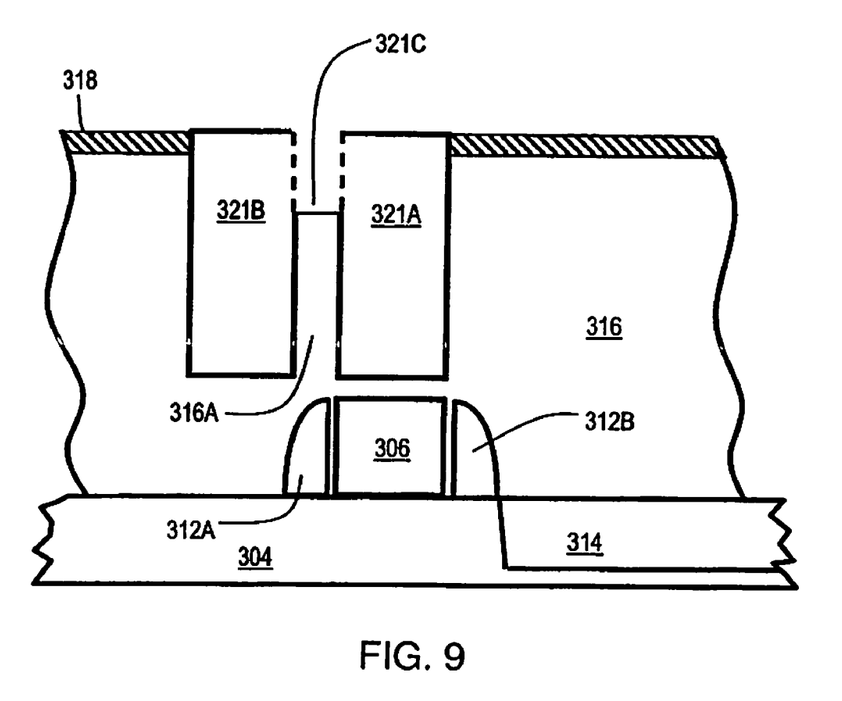

FIG. 9 shows a portion of dielectric layer 316 in between cavities 321A and 321B removed by further etching. Cavities 321A and 321B are joined at the upper portion, as the dielectric layer 316 is being etched away, by intermediate cavity 321C. Because cavities 321A and 321B form contact areas when the fabrication process is complete, cavities 321A and 321B are referred to as contact cavities. An important aspect of the intermediate cavity 321C is that it does not extend to the bottom of cavities 321A and 321B.

Figure 10:
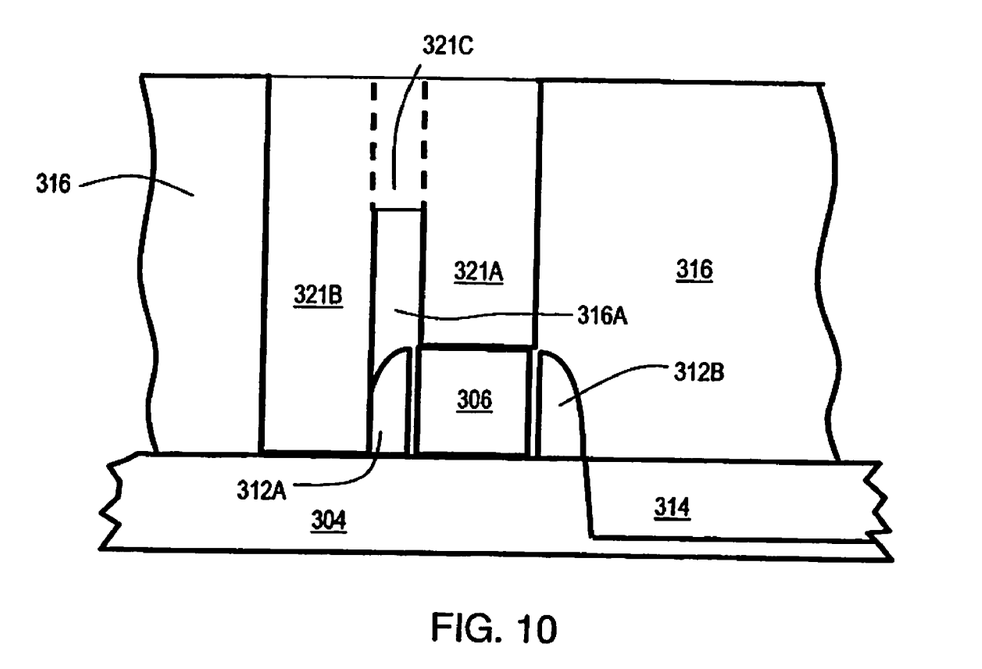

FIG. 10 shows the step where the cavities 321A and 321B have been further etched through the dielectric layer 316. Any remaining resist 318 is removed, typically, by burning it off in an oxygen plasma. Cavity 321B extends to the silicon layer 304. Cavity 321A extends to the polysilicon trace 306. Cavity 321C, while being deeper, is in contact with the sidewalls of cavities 321A and 321B and is separated by a separation region 316A of dielectric 316 above the sidewall spacer 312A.

It can now be appreciated that the resist sliver 318B (See FIG. 5) provided initial protection of the dielectric layer 316 from the etchant in the area 321C between cavity 321A and 321B, and therefore cavity 321C is not as deep as 321A and 321B. This construction step protected the top of polysilicon trace 306 and spacer 312A and the silicon trace 304 in the proximity of spacer 312A from undesired etching. By protecting the spacer 312A, the polysilicon trace 306 and silicon trace 304, the dopants applied to the silicon trace 304 during the implant phases (not described) are preserved. Moreover, the sidewall spacer 312A is completely intact and able to control further implant of dopants. By comparison, in the prior art, see FIG. 2, a portion of the polysilicon trace 306, sidewall spacer 312A, and a portion of silicon trace 304 are routinely destroyed during the etching process.

Figure 11:
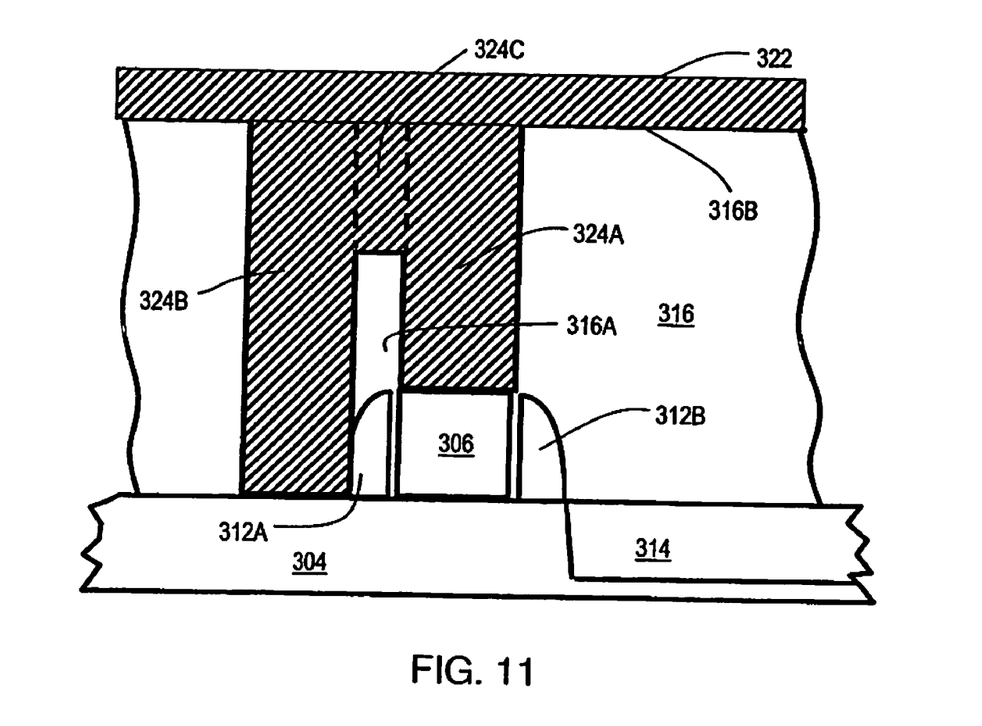

FIG. 11 shows where a conductive material 322 such as tungsten or copper has been deposited over the semiconductor. The tungsten fills cavities 321A, 321B and 321C and forms a twin CA bridge structure 350 comprising tungsten pillars 324A, 324B and 324C that are joined at the top thereof. The deposition of tungsten also forms a layer 322 on top surface 316B of the dielectric layer 316. This metal layer 322 shorts all the contacts, and must be removed for a properly functioning semiconductor device.

Figure 12:
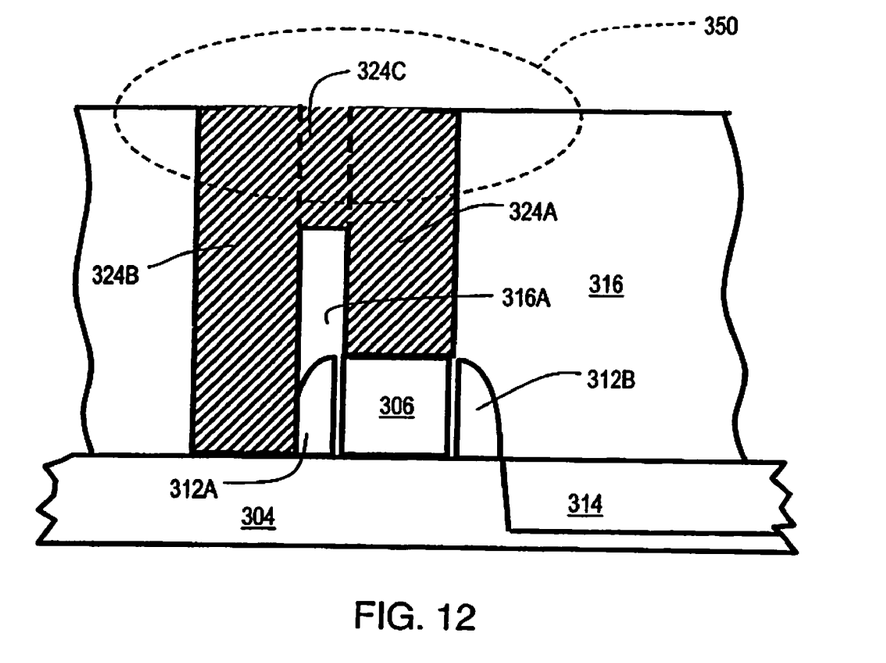

FIG. 12 shows the excess tungsten layer 322 removed by conventional means such as with a chemical mechanical polish (CMP). The end result is the twin CA bridge structure 350 which provides electrical contact between silicon trace 304 and polysilicon trace 306. The intermediate pillar 324C, see FIG. 11, is filled with tungsten and forms a bridge connecting pillars 324A and 324B.

Figure 13A:
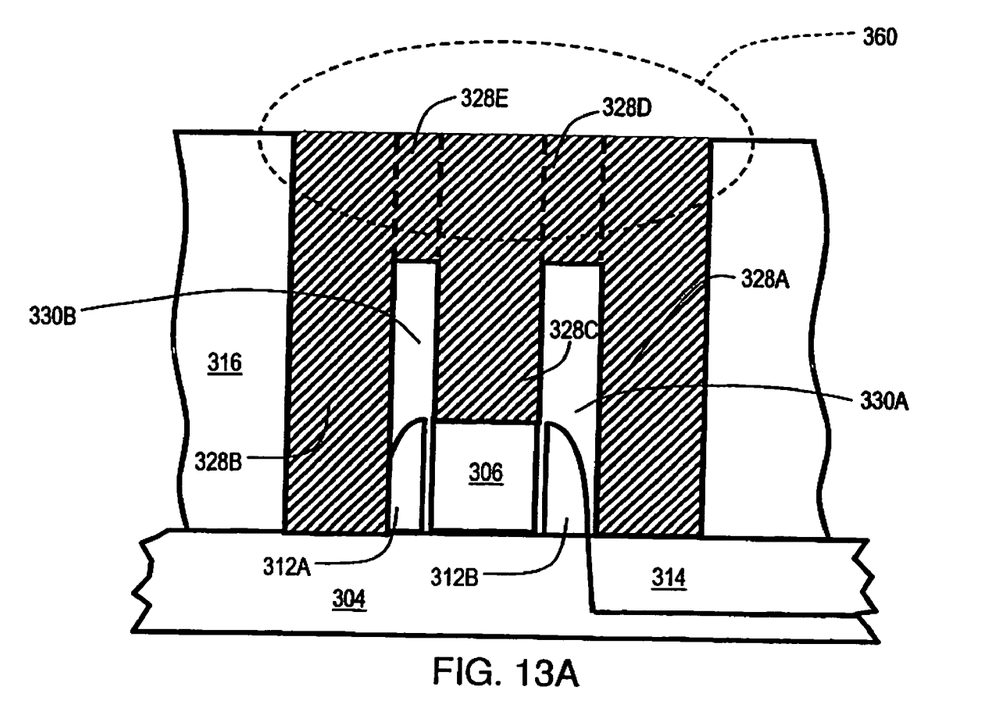
FIGS. 13A-13C show alternate embodiments of the present invention.
Figure 13B:
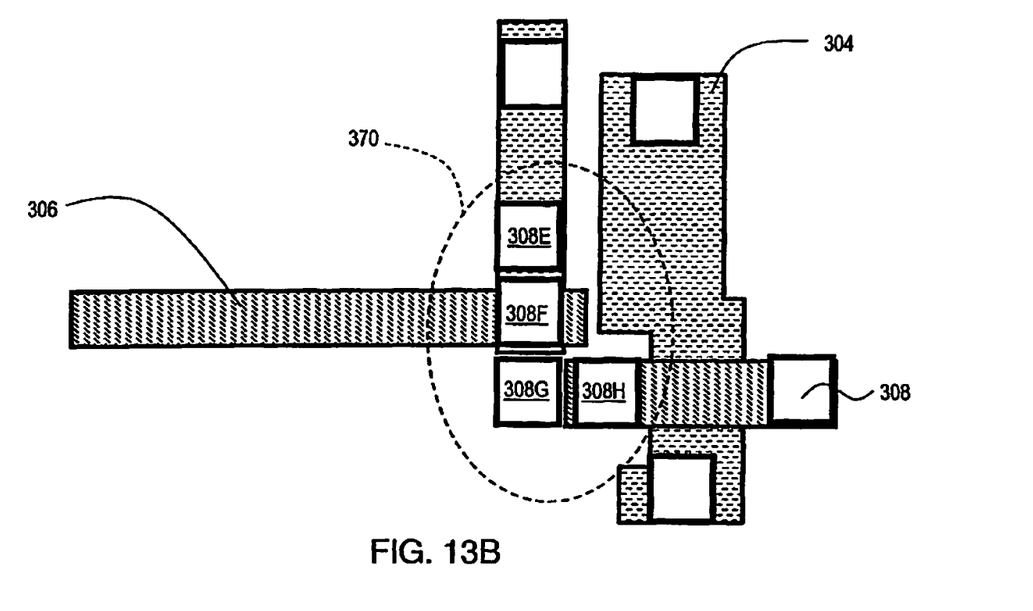
Figure 13C:
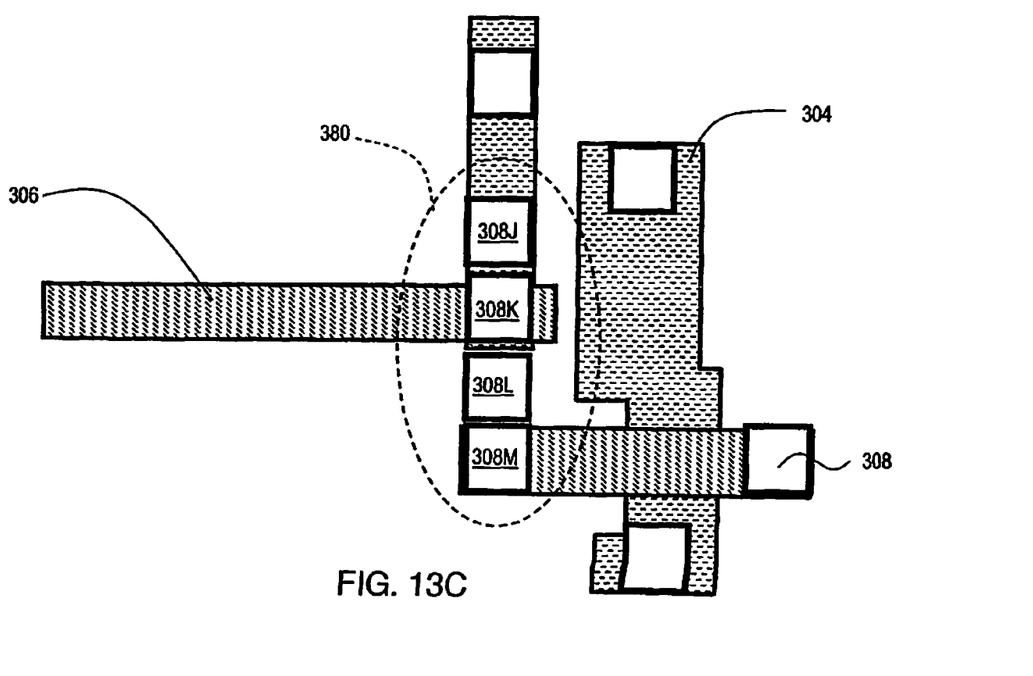

FIGS. 13A-13C show alternate embodiments of the present invention that extends this concept to more than two contacts bridged together. The joined CA bridge structure of the present invention can have more than two contacts.

FIG. 13A shows a cross sectional view of a joined CA structure 360 with three pillars of conducting material 328A, 328B, and 328C joined together, using the same technique that was described in detail for the twin CA structure 350. Pillar 328A is in contact with trace 314, pillar 328B is in contact with silicon trace 304 and pillar 328C is in contact with polysilicon silicon trace 306. First and second intermediate conductive metal pillars 328 D and 328E are formed at the upper end of the three pillars of conducting material 328A, 328B, and 328C. The first intermediate conductive metal pillar 328D is disposed between the first and second conductive metal pillars 328A and 328C and the second intermediate conductive metal pillar 328E is disposed between the second and third conductive metal pillars 328D and 328B. A first separation region 330A of dielectric 316 is disposed between the first and second conductive metal pillars 328A and 328C and a second separation region 330B of dielectric 316 is disposed between the second and third conductive metal pillars 328C and 328B, thereby forming a triple CA bridge structure.

FIG. 13B shows a plan view of a schematic design pattern for a structure employing four contacts in a right angle pattern. This joined CA structure is referred to as a Quad CA structure, and is indicated as 370. In particular, because the arrangement of contacts 308E, 308F, 308G and 308H forms a right angle, this joined CA structure 370 is referred to as a Quad CA 'L' structure. Using the techniques of present invention, as described in detail hereinbefore, contacts 308E-308H are interconnected. Contact 308G may be solely an intermediate contact, serving only to join contact 308F to 308H, i.e., contact 308G may not directly contact a transistor element. The flexibility of this technique provides allows for many possible interconnections, even if all the contacts are not collinear, as is the case with this example. However, it is also possible to have a linear Quad CA structure, where all contacts of the Quad CA structure are collinear. This is shown in FIG. 13C. In this case, contacts 308J-308M are interconnected using a linear Quad CA structure 380. Regardless of the number of contacts used to make a joined CA structure, the contact cavities are arranged in a sequence. The sequence may be linear, or may be formed with at least one right angle, or at angles other than 90 degrees. An intermediate cavity may be used to join two neighboring contact cavities. For example, in FIG. 13C, contact 308L has two neighboring contacts, 308K and 308M. There is an intermediate cavity in between the neighboring contact cavities. The intermediate cavity provides electrical contact between the two neighboring contacts once the metal deposition process has completed.

As is apparent from the aforementioned drawings and associated written description, the present invention provides an improved method and apparatus for forming connections within a semiconductor device.

It will be understood that the present invention may have various other embodiments. For example, while tungsten was used as the connecting material in the examples provided, it is possible to use the method of the present invention with other materials, such as copper.

It is also understood, of course, that while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A semiconductor structure comprising:
   a transistor comprising a first transistor element and a second transistor element;
   a contact bridge providing electrical contact between the first transistor element and the second transistor element, the contact bridge comprising:
      at least first and second metal pillars each having a lower end in electrical contact with the first and second transistor elements, respectively;
      at least a first intermediate metal pillar being disposed between, and bounded by, the first metal pillar and the second metal pillar; and
   a first separation region consisting of a single layer of dielectric disposed below the first intermediate metal pillar and between the lower ends of the first and second metal pillars; and wherein:
   the first metal pillar is oriented above and in contact with the first transistor element;
   the second metal pillar is oriented above and in contact with the second transistor element;
   first and second sidewall spacers are disposed on opposite sides of the second transistor element;
   and the first separation region of a single layer of dielectric isolates the first sidewall spacer from the first intermediate metal pillar, wherein the region bounded by the first sidewall spacer, the first metal pillar, the intermediate metal pillar, and the second metal pillar consists only of the first separation region of a single layer of dielectric.

2. The semiconductor device of claim 1, wherein the contact bridge further comprises:
   a third metal pillar, a third transistor element, and a second intermediate pillar, wherein the first, second and third metal pillars each having a lower end in electrical contact with the first, second and third transistor elements, respectively;
   the first and second intermediate metal pillars being disposed between and in electrical contact with an upper end of the first, second and third metal pillars; and a second separation regions of a single layer of dielectric disposed below the second intermediate metal pillars and between the lower ends of the second and third metal pillars.

3. The semiconductor device of claim 2 wherein:

the first, second and third metal pillars, the first and second intermediate metal pillars and the first and second separation regions are arranged substantially vertically;

the first metal pillar is oriented above and in contact with the first transistor element; the second metal pillar is oriented above and in contact with the second transistor element;

the third metal pillar is oriented above and in contact with the third transistor element;

first and second sidewall spacers are disposed on opposite sides of the second transistor element;

and the second sidewall spacer and a third sidewall spacer are disposed on opposite sides of the third transistor element; and the first separation region of dielectric isolates the first sidewall spacer from the first intermediate metal pillar and the second separation region of dielectric isolates the third sidewall spacer from the third intermediate metal pillar.

4. The semiconductor device of claim 1, wherein said first and second metal pillars and said intermediate metal pillar are formed of a material selected from the group consisting essentially of tungsten and copper.

* * * * *